United States Patent [19]
Kondo

[11] Patent Number: 5,840,618
[45] Date of Patent: Nov. 24, 1998

[54] METHOD OF MANUFACTURING SEMICONDUCTOR DEVICE USING AN AMORPHOUS MATERIAL

[75] Inventor: Toshiyuki Kondo, Tokyo, Japan

[73] Assignee: Kabushiki Kaisha Toshiba, Kawasaki, Japan

[21] Appl. No.: 717,747

[22] Filed: Sep. 23, 1996

Related U.S. Application Data

[63] Continuation of Ser. No. 515,377, Aug. 15, 1995, abandoned.

[30] Foreign Application Priority Data

Aug. 15, 1994 [JP] Japan .................................. 6-211710

[51] Int. Cl.$^6$ .................................................. H01L 21/425
[52] U.S. Cl. .......................... 438/533; 438/659; 438/660; 438/647; 438/970
[58] Field of Search .................................... 438/384, 453, 438/586, 647, 970, 533, 659, 660

[56] References Cited

U.S. PATENT DOCUMENTS

| | | |
|---|---|---|
| 4,502,206 | 3/1985 | Schnable et al. . |
| 4,769,377 | 9/1988 | Maeda . |
| 4,904,611 | 2/1990 | Chiang et al. . |
| 5,290,712 | 3/1994 | Sato et al. . |
| 5,410,174 | 4/1995 | Kalnitsky . |
| 5,444,283 | 8/1995 | Liang et al. . |

FOREIGN PATENT DOCUMENTS 63-60525  3/1988  Japan .

*Primary Examiner*—Caridad Everhart
*Attorney, Agent, or Firm*—Finnegan, Henderson, Farabow, Garrett & Dunner, L.L.P.

[57] ABSTRACT

A method of manufacturing a semiconductor device that does not interfere with electrical connection of a polysilicon interconnection layer to a source/drain region of a transistor. Patterning of the interconnection layer and the gate electrode occurs prior to removal of an underlying oxide film to prevent etching of the substrate. An interconnection layer of amorphous material is formed on the oxide film, and the patterned interconnection layer is subsequently electrically connected to the substrate by introducing ions into the amorphous material to reduce the oxide film underneath the interconnection layer. After introduction of ions into the amorphous layer, the amorphous material is crystallized to increase the conductivity of the interconnection layer.

20 Claims, 6 Drawing Sheets

METHOD OF MANUFACTURING SEMICONDUCTOR DEVICE USING AN AMORPHOUS MATERIAL

This is a continuation of application Ser. No. 08/515,377, filed Aug. 15, 1995 now abandoned.

BACKGROUND OF THE INVENTION

1. Field of the Invention

The present invention relates to a method of manufacturing a semiconductor device using an amorphous material. This method can be applied in the manufacture of devices, such as an SRAM (Static Random Access read write Memory), in which an interconnection layer connects the gate of one MOS transistor to the source or drain region of another MOS transistor.

2. Description of the Related Art

In a semiconductor device, a number of circuit elements usually are formed on a semiconductor substrate, and these elements are normally electrically interconnected to each other by some means. For example, FIG. 19 is a diagram of a conventional circuit in which the gate of a first MOS transistor is electrically connected with the source or drain region of a second MOS transistor so as to enhance the device density. Typically, a polysilicon film is used in these MOS circuits to form the gate of the MOS transistors. In order to connect the gate of a first MOS transistor to the source or drain region of a second MOS transistor, a polysilicon interconnection layer connects the gate to a direct contact region of the substrate. In the substrate, the direct contact region is adjacent to and in contact with the source or drain region of the second MOS transistor.

Unfortunately, undesirable etching into the substrate can occur during manufacture of this type of semiconductor device. For example, etching into the substrate in the vicinity of the direct contact region may interfere with electrical connection of a polysilicon interconnection layer to the source or drain region of an MOS transistor. FIGS. 1–6 illustrate how undesirable etching into the substrate can occur in a typical semiconductor device.

One conventional method for manufacturing a semiconductor device is shown in FIGS. 1–4. First, referring to FIG. 1, an oxide film 2 is formed on a device region of a silicon substrate 1, and a LOCOS (Local Oxidation of Silicon) method is typically used to form an isolation region 3 on silicon substrate 1.

Next, as shown in FIG. 2, an impurity is implanted into silicon substrate 1 in a region corresponding to the channel portion of a transistor. This channel implant step is performed to establish the threshold voltage for the channel. Subsequently, oxide film 2 is removed and a gate oxide film 4 is formed. Gate oxide film 4 is etched by isotropic or anisotropic etching to expose a direct contact portion of substrate 1.

Thereafter, a first conductive layer 5 is deposited on the semiconductor substrate and on gate oxide film 4. A portion of first conductive layer 5 will become a gate electrode. Generally, first conductive layer 5 is made of polysilicon. Subsequently, an impurity is introduced, using such techniques as ion implantation or vapor phase diffusion, in order to establish the electrical characteristics of the gate electrode and to form a diffused impurity region 6 in the direct contact portion of substrate 1.

In the fabrication method shown in FIG. 3, a metal silicide layer 7, such as tungsten silicide or molybdenum silicide, is next formed on first conductive layer 5 to improve the electrical characteristics of the gate electrode. The gate electrode is then patterned by etching of first conductive layer 5 and metal silicide layer 7. Thereafter, to form a pair of source/drain regions 8 and 18 of a transistor from diffused impurity regions, an impurity is implanted into substrate 1 by an ion implantation method.

As shown in FIG. 4, a first interlayer insulating film 9 made of $SiO_2$ is then deposited over the whole surface of the device. Next, first interlayer insulating film 9 is selectively etched. A second conductive layer 10 of aluminum is then formed on substrate 1 and first interlayer insulating film 9. Subsequently, a second interlayer insulating film 11 and a third conductive layer 12 of aluminum may be formed. Finally, after all the required interconnect layers have been formed, the whole surface of the device is coated with a protective film 13 of $Si_3N_4$.

A second conventional method for manufacturing a semiconductor device is shown in FIGS. 5–6. First, an oxide film 2 (not shown) is formed on a device region of silicon substrate 1, and an isolation region 3 is formed on silicon substrate 1, using the same fabrication method shown in FIG. 1. Next, however, as shown in FIG. 5, oxide film 2 on the surface of silicon substrate 1 is removed, and a gate oxide film 4 is formed on the substrate. Thereafter, a first conductive layer 5, generally made of polysilicon, is deposited on the semiconductor substrate and on gate oxide film 4. A portion of first conductive layer 5 will become a gate electrode.

In the fabrication method shown in FIG. 5, the gate electrode is then patterned by isotropic or anisotropic etching of first conductive layer 5 and gate oxide film 4, which causes a direct contact portion of substrate 1 to be exposed. Subsequently, an impurity is introduced, using such techniques as ion implantation or vapor phase diffusion, to form a diffused impurity region 6 in the direct contact portion of substrate 1. Thereafter, a conductive interconnection layer 14 of polysilicon is deposited on the surface of diffused impurity region 6 and first conductive layer 5. Next, a metal silicide layer 7, such as tungsten silicide or molybdenum silicide, is formed on conductive interconnection layer 14 to improve the electrical characteristics of the gate electrode.

As shown in FIG. 6, the multi-layered gate electrode is then patterned by etching of first conductive layer 5, conductive interconnection layer 14, and metal silicide layer 7. Thereafter, to form a pair of source/drain regions 8 and 18 of a transistor from diffused impurity regions, an impurity is implanted into substrate 1 by an ion implantation method.

In the fabrication method shown in FIG. 6, a first interlayer insulating film 9 made of $SiO_2$ is then deposited over the whole surface of the device. Next, first interlayer insulating film 9 is selectively etched. A second conductive layer 10 of aluminum is then formed on substrate 1 and first interlayer insulating film 9. Subsequently, a second interlayer insulating film 11 and a third conductive layer 12 of aluminum may be formed. Finally, after all the required interconnect layers have been formed, the whole surface of the device is coated with a protective film 13 of $Si_3N_4$.

In the conventional fabrication methods described above, etching into the substrate can occur during patterning of first conductive polysilicon layer 5 (FIG. 3 and FIG. 6) or patterning of conductive polysilicon interconnection layer 14 (FIG. 6). The end of the left-side portion of first conductive polysilicon layer 5 in FIG. 3 and conductive polysilicon interconnection layer 14 in FIG. 6, however, is above the direct contact portion of substrate 1. Consequently, patterning of a conductive interconnection layer and the gate electrode may interfere with electrical connection of the interconnection layer to a diffused impurity region forming a source/drain region of a transistor.

The problem of maintaining continuity of the impurity region in substrate 1 from the direct contact portion of substrate 1 to source/drain region 8 is made more difficult because it is common practice to form the gate electrode and interconnection layer out of polysilicon similar to the silicon used to form substrate 1. Consequently, it is not easy to selectively etch a polysilicon interconnection layer and polysilicon gate electrode without also etching the silicon substrate.

Therefore, in the conventional fabrication methods described above, holes may be dug in the direct contact portion of substrate 1 when a conductive polysilicon interconnection layer and/or a polysilicon gate electrode are patterned in the vicinity of the direct contact portion of the silicon substrate, as shown in FIGS. 3 and 6. In FIG. 3, a dug portion 15A is shown that has been etched into the silicon substrate. This etching may induce crystal defects into the substrate, thereby deteriorating the electrical characteristics of the semiconductor device.

In the fabrication method shown in FIG. 7, etching into the silicon substrate is avoided by utilizing an elongated gate oxide film 4. In this process, patterning of first conductive polysilicon layer 5 does not result in etching into silicon substrate 1 in the vicinity of the direct contact portion because the end of the first conductive polysilicon layer 5 is above gate oxide film 4.

In this alternate method, however, it is even more difficult to maintain continuity of the impurity region in substrate 1 from the direct contact portion of substrate 1 to source/region 8. As shown in FIG. 7, a gap designated as an offset region 15B may form between diffused impurity region 6 in the direct contact portion of substrate 1 and source/drain region 8.

To avoid formation of this gap, a semiconductor device fabricated using this method must be formed so that the direct contact portion and adjacent source/drain region 8 in substrate 1 partially overlap. To form an overlapping diffused impurity region 6 and source/drain region 8, however, an impurity is introduced at different times for each of the two diffused impurity regions. Unfortunately, this may result in relatively heavy doping of impurities in the overlapping portion of the two regions, and an uneven impurity distribution and concentration in substrate 1.

Therefore, in order to maintain continuity of an impurity region in a silicon substrate from a direct contact portion to a source/drain region, it is desirable to fabricate the device in a manner which prevents etching of the substrate when a polysilicon interconnection layer and polysilicon gate electrode are patterned. Moreover, it would be advantageous if an impurity can be introduced into both the direct contact portion and the source/drain region of the substrate at the same time.

SUMMARY OF THE INVENTION

It is an object of the invention to overcome at least some of the problems associated with conventional methods for manufacturing a semiconductor device.

It is therefore desirable to provide an improved fabrication method which does not interfere with electrical connection of a polysilicon interconnection layer to a source/drain region of a transistor. Specifically, it would be beneficial to provide a method in which etching of the substrate is prevented when a polysilicon interconnection layer and polysilicon gate electrode are patterned.

Preferably, the patterning of the interconnection layer and the gate electrode should occur prior to removal of an underlying oxide film to prevent etching of the substrate. Furthermore, it would be advantageous if this can be accomplished without requiring formation of the direct contact portion and source/drain region of the substrate at different times.

Additional objects and advantages of the invention will be set forth in part in the description which follows, and in part will be obvious from the description, or may be learned by practice of the invention. The objects and advantages of the invention may be realized and obtained by means of the instrumentalities and combinations particularly pointed out in the appended claims.

To achieve the objects and in accordance with the purposes of the invention, as embodied and broadly described herein, a method is provided for manufacturing a semiconductor device on a semiconductor substrate to form an interconnection layer in contact with an impurity region in the substrate. In this method, an oxide film is formed on the substrate; an interconnection layer of amorphous material is formed on the oxide film; and a gate electrode is formed on the oxide film. Patterning of the interconnection layer and the gate electrode occurs while the oxide film is on the substrate to prevent etching of the substrate. The interconnection layer is then electrically connected to the substrate by introducing ions into the amorphous material to reduce the oxide film underneath the interconnection layer. An impurity region is formed in a first (or direct contact) portion of the substrate underneath the interconnection layer and in a second (or source/drain) portion of the substrate extending from the interconnection layer to the gate electrode, and this impurity region is continuous from the first portion to the second portion of the substrate. After the introduction of ions into the amorphous layer, the amorphous material is crystallized to increase the conductivity of the interconnection layer.

In one embodiment of the invention, the step of crystallizing the amorphous material comprises heat treating the amorphous material. In a further embodiment, the step of electrically connecting the interconnection layer to the substrate also comprises heat treating the oxide film, after the introduction of ions into the amorphous layer, to reduce the oxide film underneath the interconnection layer of amorphous material.

In another embodiment of the invention, the substrate is a silicon substrate, and the step of electrically connecting the interconnection layer comprises ion implanting silicon or an impurity into the amorphous layer to reduce the oxide film.

In another preferred embodiment, the step of forming an impurity region comprises ion implanting an impurity into the first portion of the substrate through the interconnection layer of amorphous material and simultaneously implanting the impurity into the second portion of the substrate.

BRIEF DESCRIPTION OF THE DRAWINGS

The accompanying drawings, which are incorporated in and constitute a part of this specification, illustrate preferred embodiments of the invention and, together with the description of the invention, explain the principles of the invention.

DETAILED DESCRIPTION OF THE PREFERRED EMBODIMENTS

Reference will now be made in detail to presently preferred embodiments of the invention, examples of which are illustrated in the accompanying drawings.

The method of the present invention can be applied in the manufacture of devices, such as an SRAM, in which an interconnection layer connects the gate of one MOS transistor to the source or drain region of another MOS transistor. An example of a device of this construction is shown in FIG. 19, which is a circuit diagram of a memory cell in an SRAM.

Figure 19:
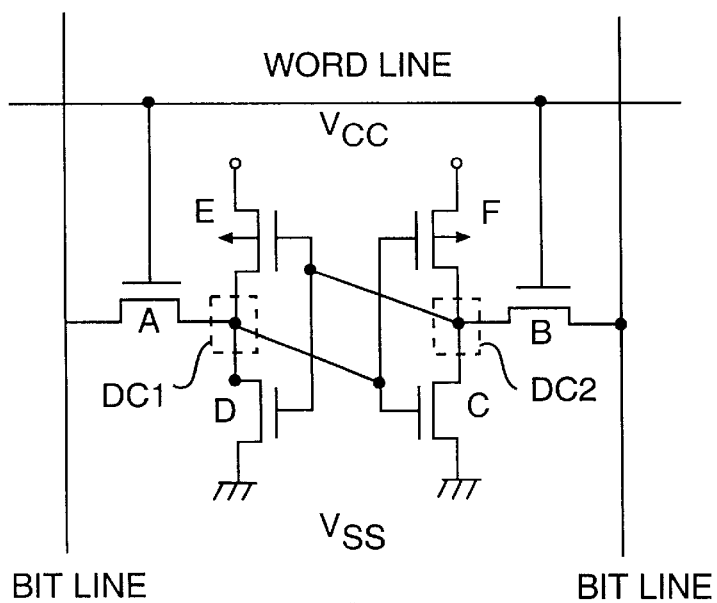
FIG. 19 is a circuit diagram of a conventional MOS circuit.

In the SRAM of FIG. 19, a memory cell is formed by a pair of MOS inverter circuits connected in a flip-flop configuration. A pair of N-type access MOS transistors A and B have gate inputs to which a word line is connected, and each transistor is respectively connected to one of a pair of memory nodes. Data is transferred to and from the bit lines through access MOS transistors A and B.

In the SRAM of FIG. 19, a pair of interconnection (or wiring) layers are shown connecting the gates of one pair of MOS transistors to the source/drain region of another pair of MOS transistors. This SRAM includes two additional N-type MOS transistors C and D and two P-type MOS transistors E and F. A direct contact portion DC1 in contact with the drain region of N-type MOS transistor D and P-type MOS transistor E is connected via one interconnection layer to the gates of N-type MOS transistor C and P-type MOS transistor F. Similarly, another direct contact portion DC2 in contact with the drain region of N-type MOS transistor C and P-type MOS transistor F is connected via another interconnection layer to the gates of N-type MOS transistor D and P-type MOS transistor E.

Of course, there are many equivalent ways in which to implement a memory cell, one of which is shown in FIG. 19. For example, the P-type MOS transistors E and F can be replaced by load elements, such as polysilicon resistors, while retaining the direct contact portions of the device.

A preferred embodiment of a method of manufacturing a semiconductor device on a semiconductor substrate to form an interconnection layer in contact with an impurity region in the substrate is shown in FIGS. 9 to 18. These drawings are cross-sectional views illustrating the steps in fabricating the device shown in FIG. 8.

Figure 9:
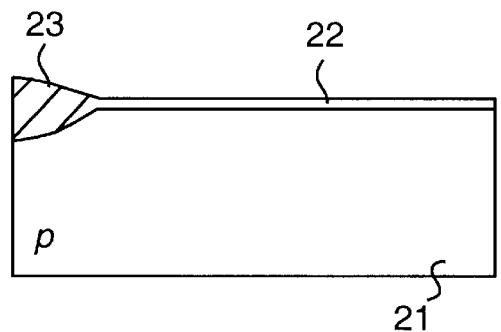
FIG. 9 is a cross-sectional view showing the fabrication of one embodiment of the invention.

As shown in FIG. 9, an oxide film 22 is formed on a device region of semiconductor substrate 21. Preferably, substrate 21 is a silicon substrate. Although substrate 21 is P-type in this embodiment, an N-type substrate also may be used as the semiconductor substrate. In addition to oxide film 22, an isolation region 23 is formed on the semiconductor substrate. A LOCOS (Local Oxidation of Silicon) method may be used to form isolation region 23.

Next, an impurity is implanted into silicon substrate 21 in a region corresponding to the channel portion of a transistor. This channel implant step is performed to establish the threshold voltage for the channel. Subsequently, oxide film 22 is removed, preferably by a wet etching process using $NH_4F$.

Figure 10:
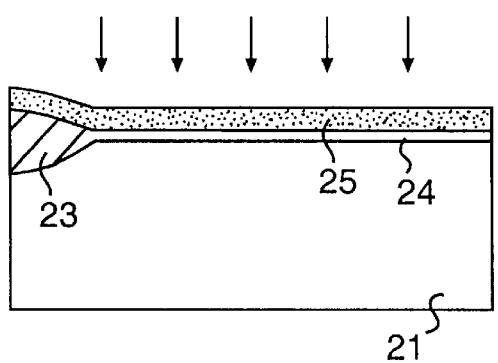
FIG. 10 is a cross-sectional view showing the fabrication of one embodiment of the invention.

In accordance with the invention, an oxide film is formed on the substrate. As shown in FIG. 10, a silicon oxide film 24 is deposited on substrate 21, preferably to a thickness of about 10 nm by thermal oxidation.

The invention also includes forming a gate electrode on the oxide film. In FIG. 10, a first conductive layer 25 of polysilicon is deposited as the first layer in a multi-layered gate electrode on oxide film 24. As embodied herein, first conductive layer 25 has a thickness of about 50 nm.

Next, as shown in FIG. 10, an impurity is implanted by ion implantation into substrate 21 to establish the electrical characteristics of the gate electrode. Whether an N-type impurity, such as phosphorus or arsenic, or a P-type impurity, such as boron, should be implanted is determined according to the desired characteristics of the transistor.

Figure 11:
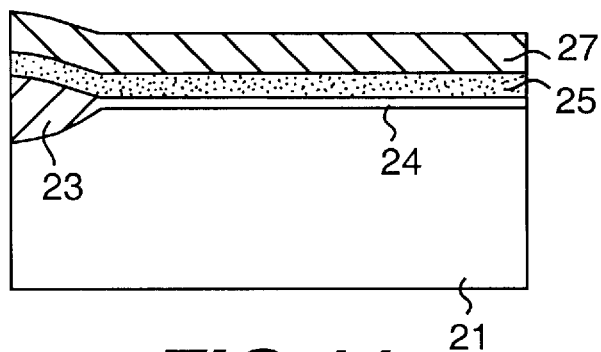
FIG. 11 is a cross-sectional view showing the fabrication of one embodiment of the invention.

In one preferred embodiment of the invention, a metal silicide film is formed on the gate electrode to prevent an impurity region subsequently formed in the substrate from extending underneath the gate electrode. In FIG. 11, a second conductive layer 27 of metal silicide, such as tungsten silicide or molybdenum silicide, is formed on first conductive layer 25 to improve the electrical characteristics of the gate electrode. Preferably, the metal silicide film has a thickness of about 50 nm.

Figure 12:
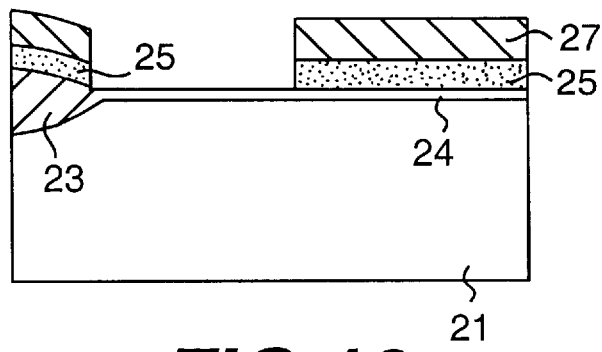
FIG. 12 is a cross-sectional view showing the fabrication of one embodiment of the invention.

Preferably, the first conductive layer is patterned to expose a portion of the oxide film above a first portion of the substrate. In accordance with the invention, patterning of the gate electrode occurs while the oxide film is on the substrate to prevent etching of the substrate. As shown in FIG. 12, portions of first conductive layer 25 and second conductive layer 27 are removed by selective anisotropic etching, using a photoresist. As a result, a portion of oxide film 24 is exposed above the direct contact portion of substrate 21.

Figure 13:
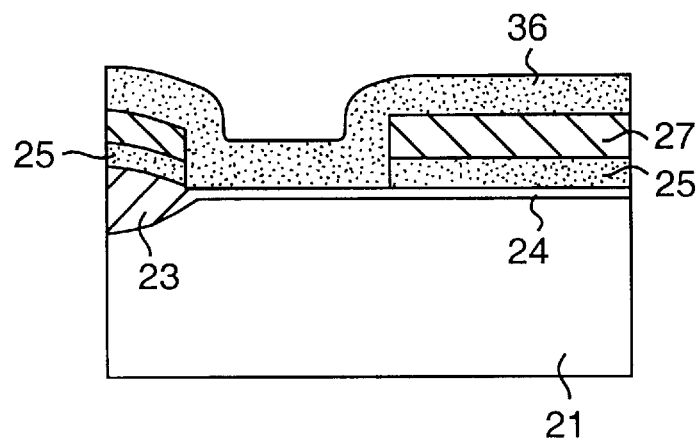
FIG. 13 is a cross-sectional view showing the fabrication of one embodiment of the invention.

The present invention includes forming an interconnection layer of amorphous material on the oxide film. As shown in FIG. 13, an interconnection layer of amorphous material is formed on the exposed portion of the oxide film and above the first conductive layer. In this embodiment, interconnection layer 36 of amorphous silicon is deposited to a thickness of less than about 200 nm on the exposed portion of oxide film 24 above the direct contact portion of substrate 21 and on the metal silicide film forming second conductive layer 27. Interconnection layer 36 of amorphous silicon can be formed by LPCVD (Low-Pressure Chemical Vapor Deposition) of silicon.

Preferably, the amorphous material is amorphous silicon. Amorphous metals, however, also can be used to form the interconnection layer provided the amorphous material is suitable for use in subsequent reduction of the underlying oxide film.

Figure 14:
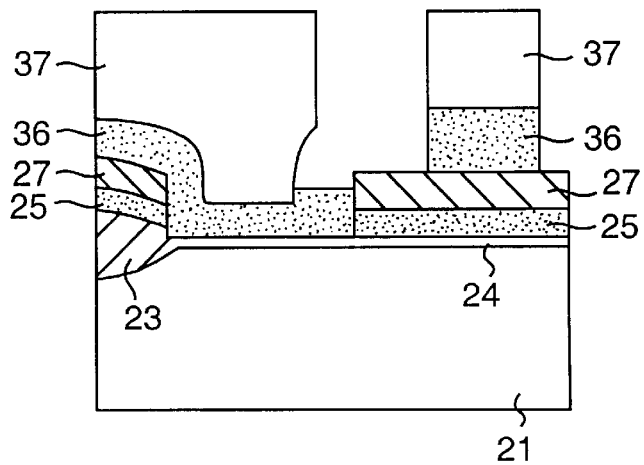
FIG. 14 is a cross-sectional view showing the fabrication of one embodiment of the invention.
Figure 15:
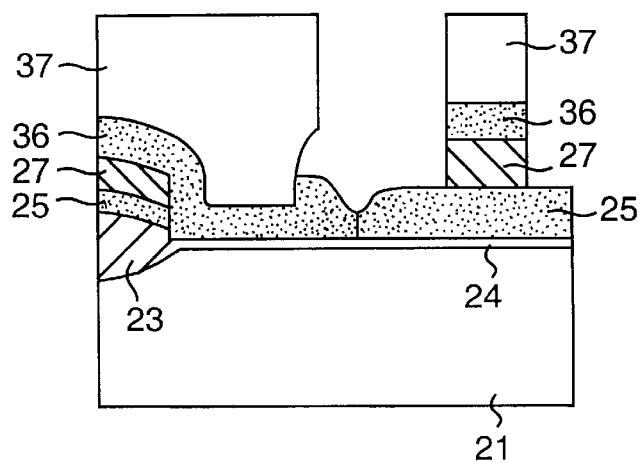
FIG. 15 is a cross-sectional view showing the fabrication of one embodiment of the invention.

In the method of the invention, the interconnection layer is patterned while the oxide film is on the substrate to prevent etching of the substrate. As shown in FIG. 14, a photoresist 37 is formed over the entire region and then patterned. Using the patterned photoresist as a mask, the interconnection layer 36 of amorphous silicon 36 is etched by CDE (Chemical Dry Etching) or by another isotropic etching technique so as to partially expose the metal silicide film forming second conductive layer 27. Thereafter, as shown in FIG. 15, only the exposed portion of the metal silicide film forming second conductive layer 27 is etched by RIE (Reactive Ion Etching) or by another anisotropic etching technique, again using photoresist 37 as a mask.

Figure 16:
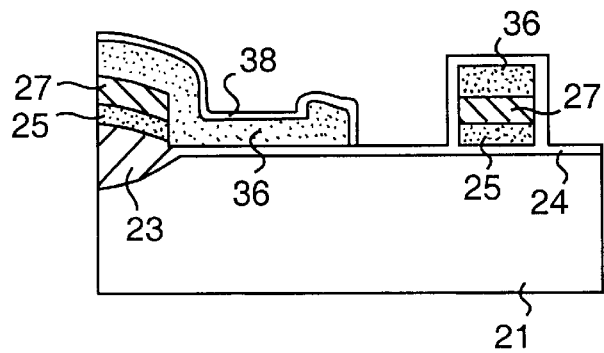
FIG. 16 is a cross-sectional view showing the fabrication of one embodiment of the invention.

In accordance with the invention, the gate electrode is separated from the interconnection layer. In the present invention, the interconnection layer is patterned while the oxide film is on the substrate to prevent etching of the substrate, and the gate electrode is patterned while the oxide film is on the substrate to prevent etching of the substrate. As shown in FIG. 16, interconnection layer 36 of amorphous silicon and first conductive layer 25 of polysilicon are patterned, again using photoresist 37 as a mask. Preferably, patterning of the gate electrode, especially first conductive layer 25 of polysilicon, is performed by etching at a low etch rate to prevent semiconductor substrate 21 from being dug. In this embodiment, a protective oxide film 38 is then formed by heating the multi-layered gate electrode and interconnection layer 36 of amorphous silicon.

Consequently, since patterning of the interconnection layer and the gate electrode occurs prior to removal of underlying oxide film 24, etching of the substrate is prevented and no holes are dug in the direct contact portion of substrate 21. As a result, such problems as generation of crystal defects in the direct contact portion of the substrate and deterioration of electrical characteristics (e.g., junction leakage or increases in junction resistance between the direct contact portion and source/drain region of the substrate) do not occur. As shown in FIG. 16, however, not only is the interconnection layer 36 (left-side portion) separated from the multi-layered gate electrode, but the interconnection layer is electrically isolated by oxide film 24 from the direct contact portion of substrate 21.

In the method of the invention, the interconnection layer is electrically connected to the substrate by introducing ions into the amorphous material to reduce the oxide film underneath the interconnection layer. In a preferred embodiment of the invention, in which the substrate is a silicon substrate, this step of electrically connecting the interconnection layer involves ion implanting either silicon or an impurity into the amorphous layer to reduce the oxide film.

Figure 17:
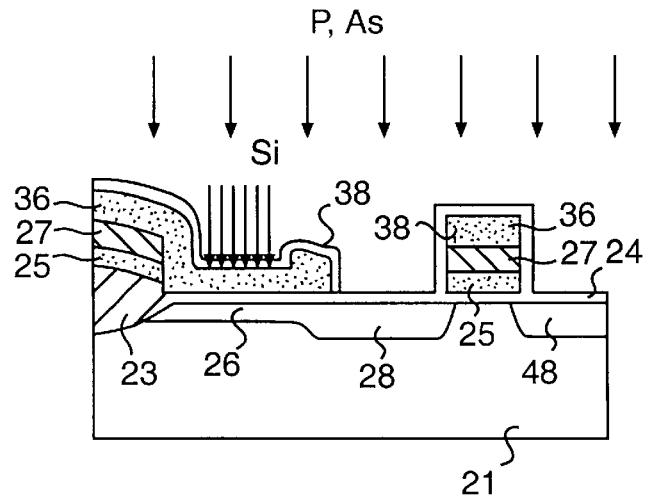
FIG. 17 is a cross-sectional view showing the fabrication of one embodiment of the invention.

As embodied in FIG. 17, ions are implanted into interconnection layer 36 of amorphous silicon above the direct contact portion of substrate 21. The introduction of these ions into the amorphous material causes reduction of oxide film 24 in the region underlying the amorphous material. Preferably, silicon ions are implanted, although impurities also may be used if suitable for purposes of reducing an oxide film.

When, for example, silicon ions are used, the ion implantation causes oxygen ions in oxide film 24 to dissociate from silicon ions in the silicon oxide film. Use of an interconnection layer of amorphous silicon, as opposed to the polysilicon layers utilized in conventional fabrication techniques, is an important feature because it allows oxide ions in oxide film 24 to more easily diffuse into interconnection layer 36. Consequently, the portion of oxide film 24 above the direct contact portion of substrate 21 is deoxidized, and interconnection layer 36 is now electrically connected to the direct contact portion of substrate 21.

In the invention, an impurity region is formed in a first portion of the substrate underneath the interconnection layer and in a second portion of the substrate extending from the interconnection layer to the gate electrode. This impurity region is continuous from the first portion to the second portion of the substrate. In a preferred embodiment, the impurity region is simultaneously formed in the first and second portions of the substrate.

Figure 18:
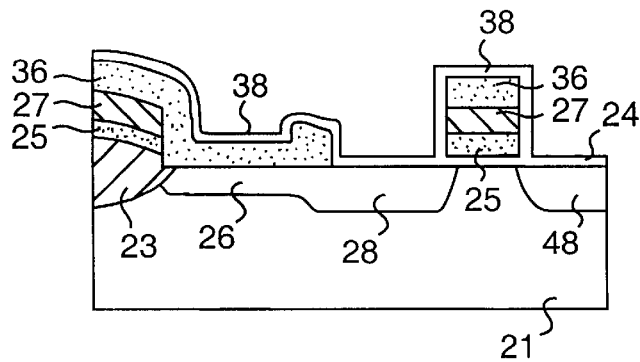
FIG. 18 is a cross-sectional view showing the fabrication of one embodiment of the invention.

Preferably, the step of forming an impurity region involves ion implanting an impurity into a first portion of the substrate through the interconnection layer of amorphous material and simultaneously implanting the impurity into a second portion of the substrate. In FIG. 17, the impurity is selectively implanted by ion implantation to form diffused impurity region 26 in the direct contact portion of substrate 21 and diffused impurity region 28 in an adjacent source/drain portion of the substrate. As shown in FIG. 18, this process results in a continuous impurity region from region 26 to region 28 of the substrate. In addition, ion implantation results in formation of diffused impurity region 48 in another source/drain portion of substrate 21.

In the embodiment illustrated in FIG. 17, substrate 21 is P-type, and an N-type diffused impurity region is formed by implanting an impurity such as phosphorus or arsenic. If an N-type substrate is used as the semiconductor substrate, or an N-type well is present in the substrate, however, a P-type diffused impurity region may be formed by implanting an impurity such as boron or $BF_2$.

In a preferred embodiment of the invention, a metal silicide film was formed on the gate electrode, prior to formation of the impurity region in the second portion of the substrate, to prevent the impurity region from extending underneath the gate electrode. As shown in FIGS. 17 and 18, second conductive layer 27 of metal silicide, which is formed on first conductive layer 25, prevents formation of the impurity region in the portion of substrate 21 substantially underneath the multi-layered gate electrode. Generally, a metal silicide film is superior to an interconnection layer of either polysilicon or amorphous silicon in its ability to stop penetration by ions. Therefore, in this embodiment, the forming of the impurity region does not cause variation in the threshold value of the transistor.

The present invention also includes crystallizing the amorphous material, after the introduction of ions into the amorphous layer, to increase the conductivity of the interconnection layer. Preferably, the crystallizing step involves heat treating of the amorphous material. Furthermore, in another preferred embodiment of the invention, heat treating of the oxide film, after ions have been introduced into the amorphous layer, reduces the oxide film underneath the interconnection layer of amorphous material, thereby electrically connecting the interconnection layer to the substrate.

As embodied herein, interconnection layer 36 of amorphous silicon is annealed so as to recrystallize it after ions have been introduced into the amorphous layer. Heat treating of the amorphous material is performed at a low temperature for a long time, for example, at 500 degrees for eight hours in a nitrogen atmosphere. This annealing step also removes oxygen from the portion of oxide film 24 between interconnection layer 36 of amorphous silicon and diffused impurity diffused region 26 in the direct contact portion of substrate 21.

In this preferred embodiment, heat treatment crystallizes interconnection layer 36 of amorphous silicon into polysilicon. Appropriate temperatures at which interconnection layer 36 is recrystallized are 480 to 600 degrees. If interconnection layer 36 of amorphous silicon has a thickness of only about 100 nm, oxide film 24 is reduced by a heat treatment at 480 degrees for about 6 hours.

An appropriate total thickness for the multi-layered gate electrode is about 300 nm. Preferably, interconnection layer 36 of amorphous silicon has a thickness of less than about 200 nm, second conductive layer 27 of metal silicide has a thickness of about 50 nm, and first conductive layer 25 has a thickness of about 50 nm. If first conductive layer 25 is thick enough to block penetration by incoming ions, second conductive layer 27 of metal silicide can be dispensed with.

Figure 1:
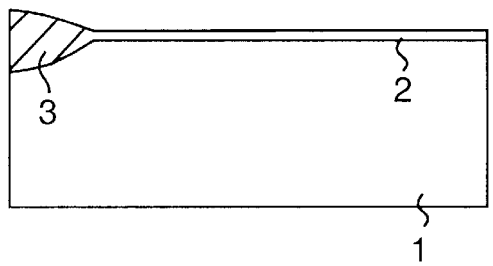
FIG. 1 is a cross-sectional view showing the fabrication of a prior art semiconductor device.
Figure 2:
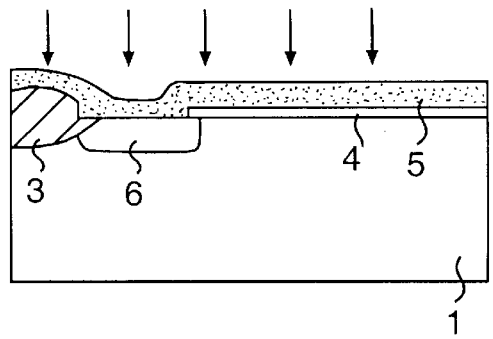
FIG. 2 is a cross-sectional view showing the fabrication of a prior art semiconductor device.
Figure 3:
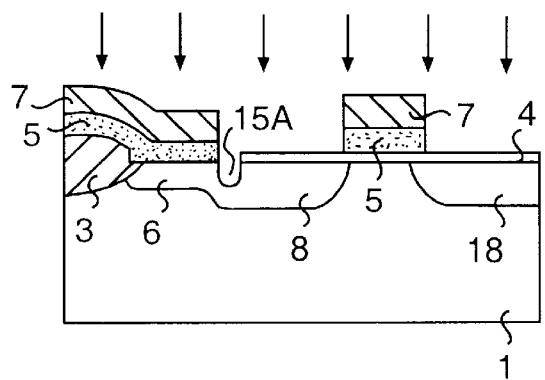
FIG. 3 is a cross-sectional view showing the fabrication of a prior art semiconductor device.
Figure 4:
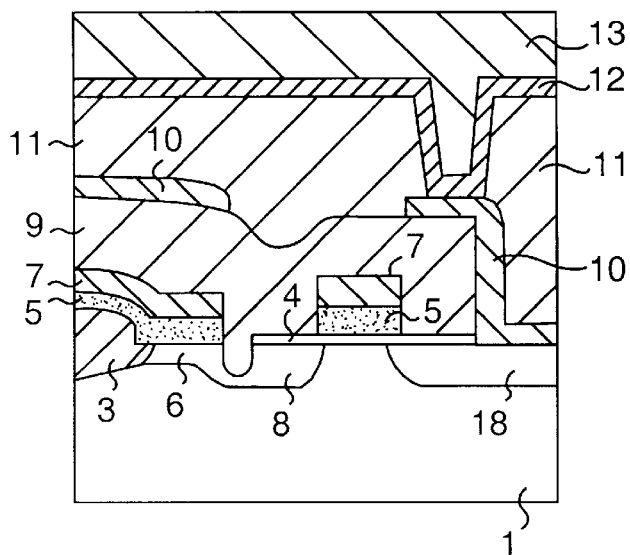
FIG. 4 is a cross-sectional view showing the fabrication of a prior art semiconductor device.
Figure 5:
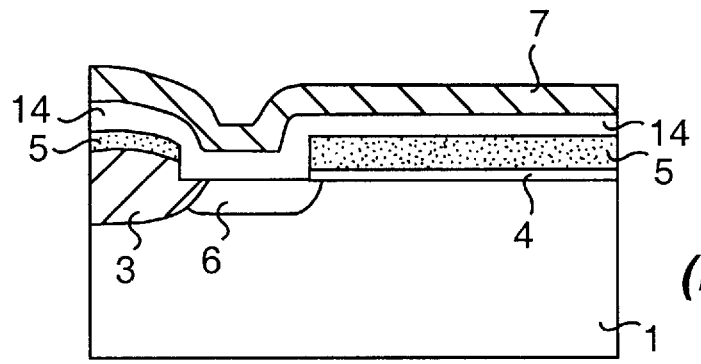
FIG. 5 is a cross-sectional view showing the fabrication of a prior art semiconductor device.
Figure 6:
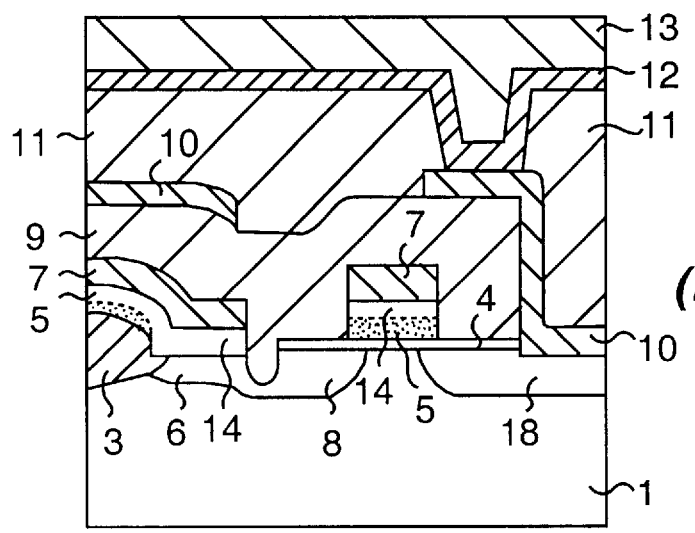
FIG. 6 is a cross-sectional view showing the fabrication of a prior art semiconductor device.
Figure 7:
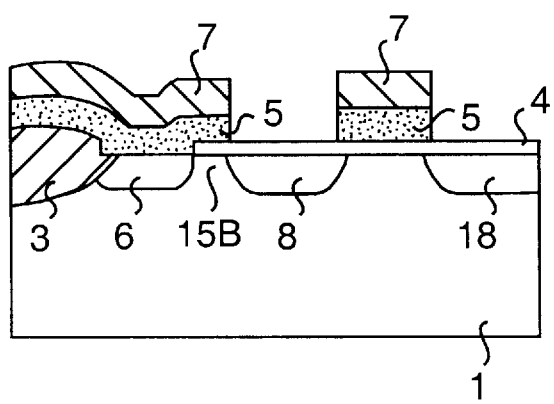
FIG. 7 is a cross-sectional view of a prior art semiconductor device.
Figure 8:
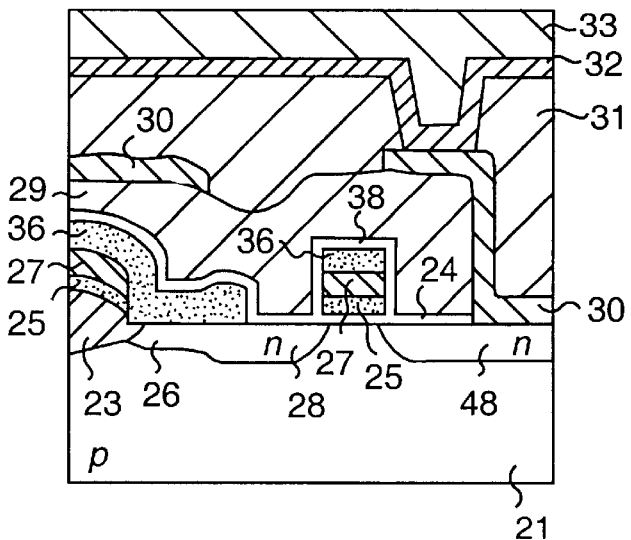
FIG. 8 is a cross-sectional view of a semiconductor device according to one embodiment of the invention.

A preferred embodiment of a semiconductor device made using the invention is shown in FIG. 8. Interconnection layer 36 of polysilicon is electrically connected to diffused impurity region 26 and also to a gate of another transistor (not shown).

As shown in FIG. 8, the multi-layered gate electrode and interconnection layer 36 of polysilicon are coated with a protective film 38 of silicon oxide. Subsequently, a first interlayer insulating film 29 made of $SiO_2$ is then deposited over the whole surface of the device using CVD (Chemical Vapor Deposition). Next, a second conductive layer 30 of aluminum is formed on substrate 21 and first interlayer insulating film 29. Subsequently, a second interlayer insulating film 31 and a third conductive layer 32 of aluminum may be formed. Finally, after all the required interconnect layers have been formed, the whole surface of the device is coated with a protective film 33 of $Si_3N_4$.

It will be apparent to those skilled in the art that various modifications and variations can be made in the present invention without departing from the scope or spirit of the invention. Thus, it is intended that the present invention cover the modifications and variations of this invention provided they come within the scope of the appended claims and their equivalents.

What is claimed is:

1. A method of manufacturing a semiconductor device on a semiconductor substrate to form an interconnection layer in contact with an impurity region in the substrate, the method comprising the following steps:

forming an oxide film on the substrate;

forming an interconnection layer of amorphous material on the oxide film;

forming a gate electrode on the oxide film;

patterning the interconnection layer while the oxide film is on the substrate to prevent etching of the substrate;

patterning the gate electrode while the oxide film is on the substrate to prevent etching of the substrate, wherein the gate electrode is separated from the interconnection layer;

electrically connecting the interconnection layer to the substrate by introducing ions into the amorphous material to reduce the oxide film underneath the interconnection layer;

forming an impurity region in a first portion of the substrate underneath the interconnection layer and in a second portion of the substrate extending from the interconnection layer to the gate electrode, wherein the impurity region is continuous from the first portion to the second portion of the substrate; and crystallizing the amorphous material, after the introduction of ions into the amorphous layer, to increase the conductivity of the interconnection layer.

2. A method of manufacturing a semiconductor device in accordance with claim 1, in which:

the step of crystallizing the amorphous material comprises heat treating the amorphous material.

3. A method of manufacturing a semiconductor device in accordance with claim 2, in which:

the step of electrically connecting the interconnection layer to the substrate further comprises heat treating the oxide film, after the introduction of ions into the amorphous layer, to reduce the oxide film underneath the interconnection layer of amorphous material.

4. A method of manufacturing a semiconductor device in accordance with claim 3, in which the substrate is a silicon substrate, and in which:

the step of electrically connecting the interconnection layer comprises ion implanting silicon into the amorphous layer to reduce the oxide film.

5. A method of manufacturing a semiconductor device in accordance with claim 2, in which the substrate is a silicon substrate, and in which:

the step of electrically connecting the interconnection layer comprises ion implanting silicon into the amorphous layer to reduce the oxide film.

6. A method of manufacturing a semiconductor device in accordance with claim 3, in which the substrate is a silicon substrate, and in which:

the step of electrically connecting the interconnection layer comprises ion implanting an impurity into the amorphous layer to reduce the oxide film.

7. A method of manufacturing a semiconductor device in accordance with claim 2, in which the substrate is a silicon substrate, and in which:

the step of electrically connecting the interconnection layer comprises ion implanting an impurity into the amorphous layer to reduce the oxide film.

8. A method of manufacturing a semiconductor device in accordance with claim 7, in which:

the step of forming an interconnection layer of amorphous material comprises low-pressure chemical vapor deposition of silicon.

9. A method of manufacturing a semiconductor device in accordance with claim 6, in which:

the step of forming an interconnection layer of amorphous material comprises low-pressure chemical vapor deposition of silicon.

10. A method of manufacturing a semiconductor device in accordance with claim 5, in which:

the step of forming an interconnection layer of amorphous material comprises low-pressure chemical vapor deposition of silicon.

11. A method of manufacturing a semiconductor device in accordance with claim 4, in which:

the step of forming an interconnection layer of amorphous material comprises low-pressure chemical vapor deposition of silicon.

12. A method of manufacturing a semiconductor device in accordance with claim 7, in which:

the step of forming an impurity region comprises ion implanting an impurity into the first portion of the substrate through the interconnection layer of amorphous material and simultaneously implanting the impurity into the second portion of the substrate.

13. A method of manufacturing a semiconductor device in accordance with claim 6, in which:

the step of forming an impurity region comprises ion implanting an impurity into the first portion of the substrate through the interconnection layer of amorphous material and simultaneously implanting the impurity into the second portion of the substrate.

14. A method of manufacturing a semiconductor device in accordance with claim 5, in which:

the step of forming an impurity region comprises ion implanting an impurity into the first portion of the substrate through the interconnection layer of amorphous material and simultaneously implanting the impurity into the second portion of the substrate.

15. A method of manufacturing a semiconductor device in accordance with claim 4, in which:

the step of forming an impurity region comprises ion implanting an impurity into the first portion of the substrate through the interconnection layer of amorphous material and simultaneously implanting the impurity into the second portion of the substrate.

16. A method of manufacturing a semiconductor device in accordance with claim 15, and further comprising:

forming a metal silicide film on the gate electrode, prior to formation of the impurity region in the second portion of the substrate, to prevent the impurity region from extending underneath the gate electrode.

17. A method of manufacturing a semiconductor device in accordance with claim 14, and further comprising:

forming a metal silicide film on the gate electrode, prior to formation of the impurity region in the second portion of the substrate, to prevent the impurity region from extending underneath the gate electrode.

18. A method of manufacturing a semiconductor device in accordance with claim 13, and further comprising:

forming a metal silicide film on the gate electrode, prior to formation of the impurity region in the second portion of the substrate, to prevent the impurity region from extending underneath the gate electrode.

19. A method of manufacturing a semiconductor device in accordance with claim 12, and further comprising:

forming a metal silicide film on the gate electrode, prior to formation of the impurity region in the second portion of the substrate, to prevent the impurity region from extending underneath the gate electrode.

20. A method of manufacturing a semiconductor device on a silicon substrate to form an interconnection layer in contact with an impurity region in the substrate, the method comprising the following steps:

forming an oxide film on the substrate;

forming a first conductive layer on the oxide film;

patterning the first conductive layer to expose a portion of the oxide film above a first portion of the substrate;

forming an interconnection layer of amorphous material on the exposed portion of the oxide film and above the first conductive layer;

patterning the interconnection layer while the oxide film is on the substrate to prevent etching of the substrate;

patterning the first conductive layer to form a gate electrode while the oxide film is on the substrate to prevent etching of the substrate, wherein the gate electrode is separated from the interconnection layer;

electrically connecting the interconnection layer to the substrate by introducing ions into the amorphous material to reduce the oxide film underneath the interconnection layer;

simultaneously forming an impurity region in the first portion of the substrate underneath the interconnection layer and in a second portion of the substrate extending from the interconnection layer to the gate electrode, wherein the impurity region is continuous from the first portion to the second portion of the substrate; and crystallizing the amorphous material, after the introduction of ions into the amorphous layer, to increase the conductivity of the interconnection layer.

* * * * *